(12) United States Patent  
Raahemi

(10) Patent No.: US 7,257,759 B2
(45) Date of Patent: Aug. 14, 2007

(54) ACCOUNTING FOR ERROR CARRYOVER IN ERROR CORRECTION ON M-BIT ENCODED LINKS

(75) Inventor: Bijan Raahemi, Ottawa (CA)

(73) Assignee: Alcatel Lucent, Paris (FR)

( * ) Notice: Subject to any disclaimer, the term of this patent is extended or adjusted under 35 U.S.C. 154(b) by 436 days.

(21) Appl. No.: 10/921,094

(22) Filed: Aug. 19, 2004

(65) Prior Publication Data

US 2006/0041817 A1     Feb. 23, 2006

(51) Int. Cl.
*H03M 13/00* (2006.01)
(52) U.S. Cl. .................. 714/752; 714/735; 714/704
(58) Field of Classification Search ............... 714/752, 714/755, 735, 776, 718, 704, 703, 1, 5
See application file for complete search history.

(56) References Cited

U.S. PATENT DOCUMENTS 6,694,472 B1*   2/2004   Perry et al. ............... 714/752
6,731,692 B1*   5/2004   Bhoja ........................ 375/286
2003/0145196 A1*  7/2003   Heegard et al. ............ 713/150

OTHER PUBLICATIONS

Media Access Control (MAC)Parameters, Physical Layer, and Management Parameters for 10 Gb/s Operation, IEEE Draft P802.3ae/D5.0, May 1, 2002.

* cited by examiner

*Primary Examiner*—Guy Lamarre
*Assistant Examiner*—Fritz Alphonse
(74) *Attorney, Agent, or Firm*—Kramer & Amado, P.C.

(57) ABSTRACT

64/66b encoding (IEEE 802.3ae Standard for 10 Gigabit Ethernet) is based on a self-synchronous scrambler which inherently duplicates errors occurring in the transmission line. An error carryover indicator ECI vector is used to correct duplicated errors crossing the codeword boundary and entering into the next codeword. The ECI vector is updated for each codeword $C(i)$ to provide the position of the erroneous bit(s) carried over to the next codeword $C(i+1)$. The codeword $C(i+1)$ is corrected by XOR-ing it with the ECI vector.

19 Claims, 4 Drawing Sheets

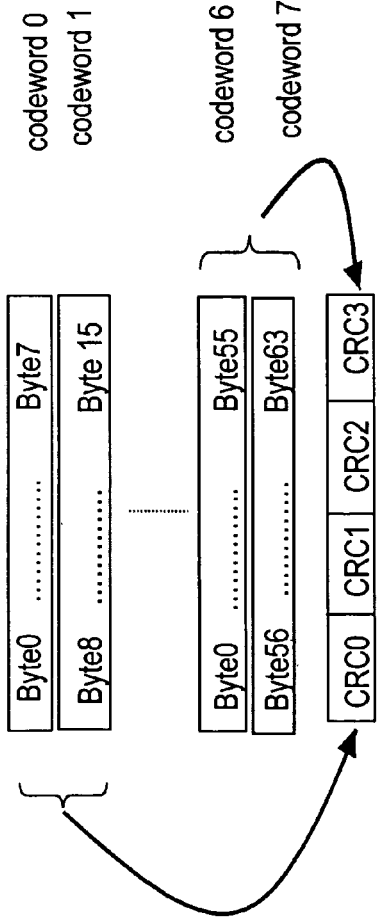
FIGURE 2
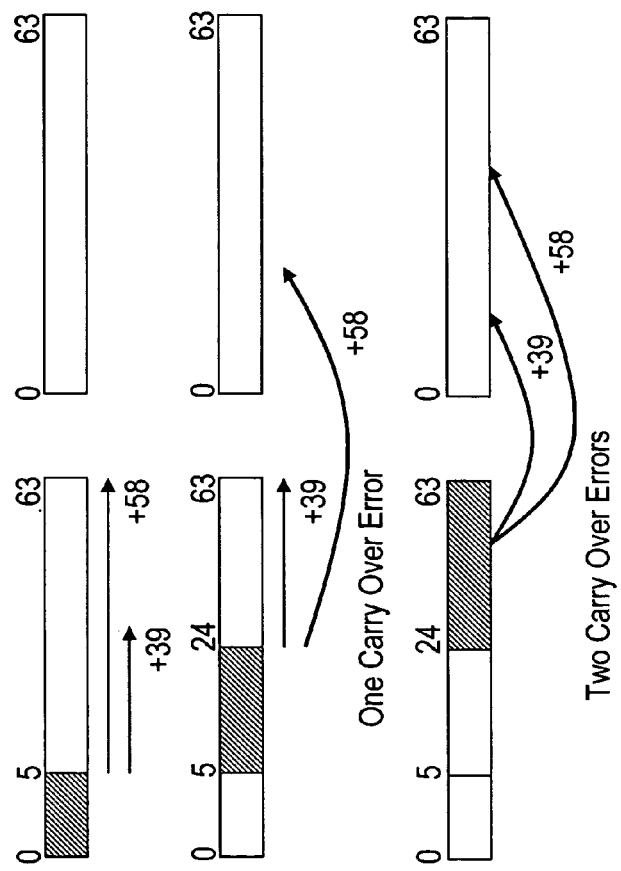
FIGURE 3a
FIGURE 3b
FIGURE 3c

ACCOUNTING FOR ERROR CARRYOVER IN ERROR CORRECTION ON M-BIT ENCODED LINKS

FIELD OF THE INVENTION

The invention is directed to error correction in communication networks, and in particular to an error correction scheme that accounts for error carry-over on M-bit encoded links.

BACKGROUND OF THE INVENTION

Interconnection of high speed components of a node is performed via the backplane or wires (cable, optical fiber), requiring close attention to error handling, especially at bit rates of multiple of Gb/s. In search of a low overhead and efficient line encoding, the IEEE task force has adopted a 64b/66b encoding scheme for 10 GB Ethernet into the IEEE802.3ae. This scheme uses a small overhead for error correction (only 3.125%), which provides an acceptable level of transmission density and run length.

In accordance with the 64b/66b encoding scheme, each 64 bits word is scrambled using a polynomial of the form $x^{58}+x^{39}+1$, and a two-bit preamble is added to the scrambled word for differentiating data words from data and control words. While scrambling enables better recovery of the received data (fast synchronization), a self-synchronous scrambler has the disadvantage that it duplicates the errors, i.e. every transmission error results after descrambling in two additional errors.

On the other hand, there is no provision in IEEE802.3ae for single or multiple error correction of 64b/66b encoded lines. Error duplication at the receiver compounds the gravity of the problem. Consequently, a simple error correction scheme is not sufficient in 64b/66b encoders.

U.S. patent application Ser. No. 10/629,690 (Raahemi) entitled "Error Correction On M-Bit Encoded Links" filed on Jul. 30, 2003 and assigned to Alcatel Inc. proposes a simple and fast error-correction scheme that can be used in conjunction with the 64b/66b encoding in products where intra-board (chip-to-chip) or inter-shelf interconnections of high speed elements are required. It utilizes the CRC16 to detect and correct all single-bit errors and detects all multiple-bit errors. The content of that patent application is incorporated herein by reference.

While the method proposed by patent application Ser. No. 10/629,690 optimizes the error detection and correction, it however considers each codeword individually, isolated from the previous codeword, meaning that it does not take into account errors which might cross the codeword boundary and enter into the next codeword. There is a need to provide a simple and fast error-correction scheme for the 64b/66b encoding that takes into account errors which cross the codeword boundaries.

SUMMARY OF THE INVENTION

It is an object of the invention to provide an error correction scheme that accounts for error carry-over, that alleviates totally or in part the drawbacks of the prior art error correction schemes.

Accordingly, the invention provides a method of correcting, at the receive side of a communication system, carry-over errors generated by a self-synchronizing scrambler at the transmit side of the communication system, comprising:
a) defining an error carryover indicator (ECI) vector and initializing the vector to a reset value; b) determining the position error_bit of an erroneous bit in a codeword C(i) and correcting the erroneous bit; c) if the error_bit is outside a first range defined between bit position 0 and the bit position R1 in the codeword C(i), updating the ECI vector to a current value; d) if the error_bit is in the first range, setting the current value of the ECI(i) vector to the reset value; e) correcting any carryover error within the codeword C(i+1) using the current value ECI(i) of the ECI vector; and f) repeating steps b-e for each codeword received at the received side, wherein N is the number of bits in a codeword.

The invention also provides an error control block receiver (ECB_Rx) for decoding N-bit codewords that have been scrambled at transmission using a self-synchronizing scrambler, comprising: means for storing M codewords; error computation means for detecting and correcting a single-bit error in a codeword C(i); a syndrome table for determining the bit position error_bit of the single-bit error; an error carryover indicator (ECI) generator for locating a carryover error in a next codeword C(i+1), induced by the single-bit error; and means for correcting the carryover error using the ECI vector.

Advantageously, the invention enables a network/service provider to enhance the quality of the transmission in that it optimizes error detection and correction. The invention provides a single-bit error correction over 64b/66b encoded links as per the above identified Patent Application; it has been shown that a single-bit error correction can significantly enhance the quality of the link. In addition, the invention presents ways to take into account the error multiplication effect of self-synchronous scramblers, which are deployed in the IEEE 802.3 10 Gb Ethernet.

Since the error correction mechanism is 64-bit aligned, it is compatible with the structure of 10 GbE defined in the IEEE 802.3. Moreover, the mechanism of the invention is general and applicable to other encoding schemes with self-synchronous scrambler, regardless of the polynomial of the scrambler and the polynomial of the CRC16. The program associated with the invention can be readily modified to generate a "syndrome table" for a new application, provided that a corresponding syndrome table is provided for such an application.

BRIEF DESCRIPTION OF THE DRAWINGS

The foregoing and other objects, features and advantages of the invention will be apparent from the following more particular description of the preferred embodiments, as illustrated in the appended drawings, where:

FIG. 2 shows the buffer format in the transmit and receive blocks of FIG. 1;

FIG. 3a illustrates a scenario where the duplicate errors are inside the same codeword;

FIG. 3b shows a scenario wherein one of the duplicated errors crosses the codeword boundary;

FIG. 3c shows a scenario wherein both duplicated errors cross the codeword boundary;

DETAILED DESCRIPTION

Error correction on high speed interconnection links, backplane or extended wires (cable, optical fiber) is strongly considered by many telecommunication vendors, especially those who offer "scalable routers". 10 GE protocol is a good candidate for high speed interconnection. As such, error correction on 64b/66b encoded links is an important issue for the other telecom vendors.

As indicated above, the IEEE 802.3 standard does not provision for error corrections on 64b/66b encoded lines, whereas the above-identified U.S. patent application Ser. No. 10/629,690 presents a mechanism and a syndrome table for uniquely correcting all patterns of single-bit errors. It is to be noted that the following description is illustrative of the principles of the invention and that well known units have not been shown or described in detail to avoid unnecessary obscuring the invention. The general principles described here may be applied to other embodiments and applications, without departing from the scope of this invention.

The ensuing description refers to the mechanism of that Patent Application and is described next in connection with FIG. 1, for better understanding of the present invention.

Figure 1:
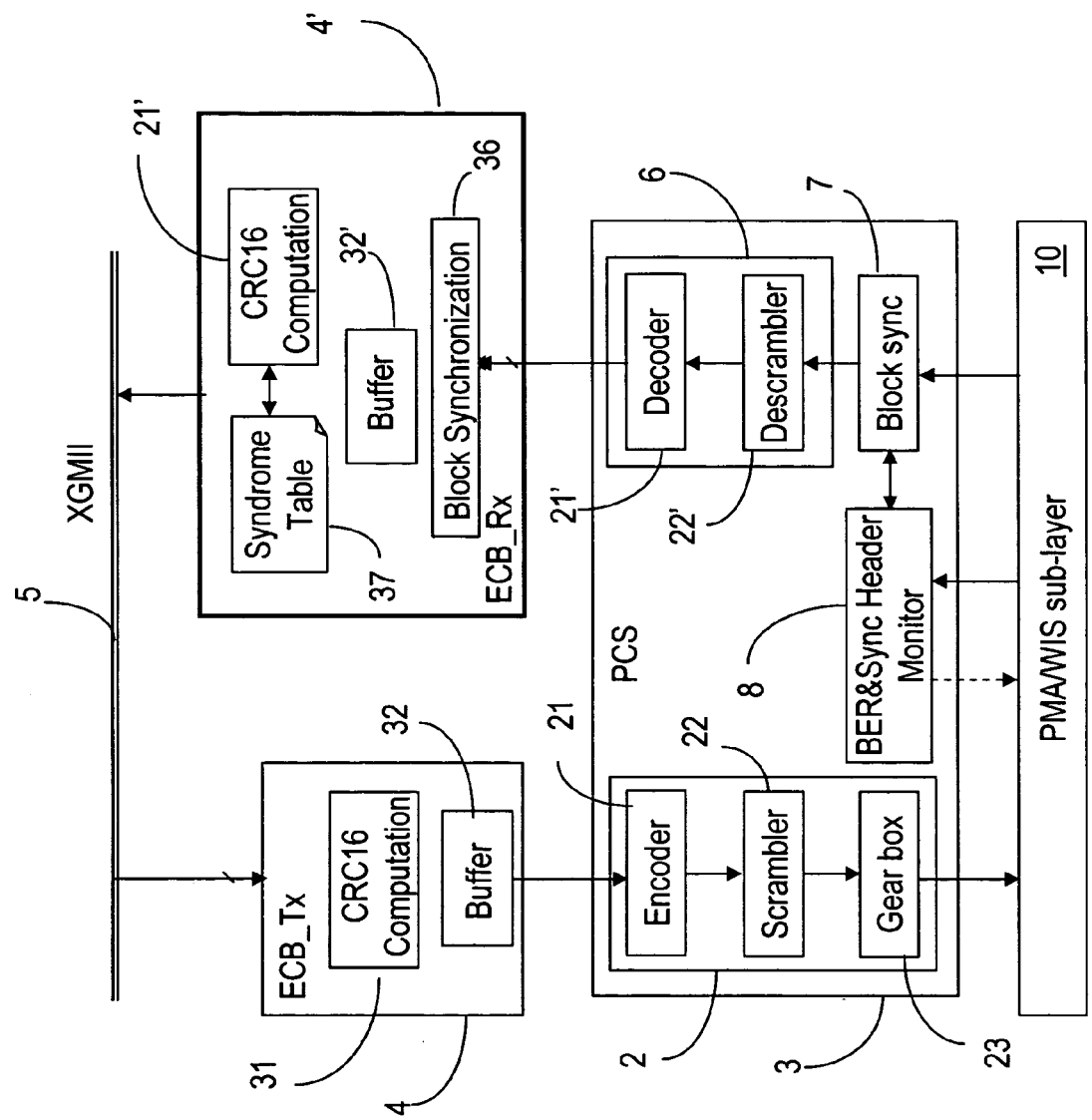
FIG. 1 is a functional block diagram of the physical coding sub-layer (PCS) in 10 GBASE-R Ethernet PHY, including the error correction blocks as provided in U.S. patent application Ser. No. 10/629,690.

FIG. 1 shows the functional units of the physical coding sub-layer (PCS) 3 participating in the data transmission and that are relevant to this invention. At the transmit side 2 of the PSC 3, the data is encoded as shown at 21 using a 64b/66b encoding. The encoded data is then scrambled using a self-synchronous scrambler 22. The data is then transmitted to the receiving side of the PCS 3 over a physical medium attachment (PMA) or WAN interface sub-layer 10. Transmission and protocol conversion gear is generically shown at 23.

At the receive side 6, the data received from the PMA/WIS sub-layer 10 and synchronized at 7 is de-scrambled at 22' and then decoded at 21'.

An Error Control Block (ECB) 4, 4' is added between the 10 Gb media independent interface XGMII 5 and the PCS 3, in both transmit and receive directions. In the transmission direction, block ECB_Tx 4 calculates CRC16 over every two successive codewords, and appends it to the data. In the receive direction, block ECB_Rx 4' calculates the CRC16 of the received codewords and uses a predefined syndrome table 37 to correct single-bit errors, if any.

As shown in FIG. 1, the ECB_Tx 4 includes a buffer 32 which may hold for example nine 64 bits (8 bytes) codewords. Buffer 32 can be viewed as a 9×8 bytes matrix, which has 9 rows, with one codeword per row, as shown in the example of FIG. 2. The first 8 rows of buffer 32 are used to store 8 codewords of data received from XGMII 5. The last row of the buffer is used to store 4 CRC16s. Thus, the ECB_Tx module 4 calculates CRC16 over every 2 consecutive codewords (rows) of the buffer, and stores the results in the last row. For example, the CRC16 generator polynomial used by the CRC15 computation unit 31 at transmitter is the ITU-T polynomial: $x^{16}+x^{12}+x^5+1$, bu the invention is not limited to this type of CRC calculation unit.

By the time the 8 codewords are in the transmit buffer, and their corresponding CRC16s are calculated, the buffer is ready to be transmitted. Since the last row is also 8 bytes, the buffer is codeword-aligned, and there is no need for boundary adjustment.

At the receive site, the ECB_Rx module 4' includes a 9×8 bytes buffer 32', similar to buffer 32 at the transmit site. The data received from PCS 3 are buffered in buffer 32', and CRC16 computation unit 31' calculates CRC16 over every two consecutive codewords (rows), as well as the CRC corresponding to the two rows. If the resulting CRC is 0, no error has occurred, and the two codewords can be delivered to XGMII 5. A CRC that is not 0 is an indication of one or more errors. The non-zero CRC is called the error syndrome. The syndrome is compared against a syndrome table 37 to determine whether the error is correctable or not. If the syndrome is found in the syndrome table 37, a single-bit error has occurred which can be corrected. The index of the syndrome in the table determines which bit is in error. In other words, the syndrome table provides the position of the erroneous bit.

The syndrome table 37 has 18 rows and eight columns, namely 16 rows of codewords and two rows for the corresponding CRC. For example, if the syndrome is found at row <i> and column <j> of the table 37, it means that bit <j> of byte <i> is in error, and can be corrected. If the syndrome is not found in the table, then more than one error has occurred, and the data can not be corrected.

However, since error correction is performed at the receiver after the signal is descrambled, a single-bit error might be duplicated by the self-synchronous scrambler 22. The error correction method described above considers each codeword individually, and it does not take into account the errors which might cross a codeword boundary, and affect the next codeword. These errors that are duplicate of the errors in the transmission line introduced by the self-synchronous scrambler, are referred here as duplicated errors. A duplicated error may in some instances cross the codeword boundary and enter into the next codeword; this is called here a "carryover error". When checking next codeword for possible errors, one should also be able to correct the effect of the duplicated errors carried over from the previous codeword.

The ECB_Rx module is modified according to the invention to take this fact into account when calculating the error syndrome. To this end, the present invention proposes introduction of a new 64-bit vector, called "Error Carryover Indicator (ECI)". The ECI vector is used for a new procedure designed to account for duplicated errors crossing the codeword boundary, and entering into the next codeword (carryover errors). Namely, the ECI vector indicates whether a duplicated error has crossed a codeword boundary. It also indicates which bit position in the next codeword is affected by the carryover error.

FIGS. 3a-3c show possible scenarios for error duplication inside and outside of a 64-bit codeword. Let's assume that self-synchronous scrambler 22 uses for line encoding the polynomial:

$$x^{58}+x^{39}+1 \qquad \text{EQ1}$$

In this particular case, the duplicated errors appear in a codeword whenever the single-bit error affects bits 1-5 of this codeword, as shown in FIG. 3a. In the case presented in FIG. 3b, one of the duplicated errors crosses into the next codeword. With a scrambler using the polynomial of EQ1, this occurs when the single-bit error is positioned between bits 5 and 24, as shown in FIG. 3b. Finally, both duplicated errors cross into the next word if the position of the single-bit error is between bits 24 and 63, as shown in FIG. 3c.

However, the solution proposed by the present invention is general, and does not depend on the length of the codeword, or the polynomial of the self-synchronous scrambler. We denote the codeword affected by the single-bit error with C(i), the position of the error in codeword C(i) with error_bit and the codeword length with N. As shown above in connection with FIGS. 3a-3c, the duplicated errors remain in codeword C(i) or are carried over in the next codeword C(i+1) according to the range of error_bit. Thus, both duplicated errors remain in C(i) if error_bit is within a first range [0, R1], or in other words if 0≦error_bit≦R1. In the example of FIG. 3a, R1=5. At least one crossover error is generated whenever the position of error_bit is between R1 and (N-1).

Thus, if error_bit is in a second range between R1 and R2, i.e. R1<error_bit≦R2, one of the duplicated errors crosses into C(i+1), as shown in FIG. 3b. In the particular example above (the scrambler uses the polynomial of EQ1, and the codeword length is N=64), R2=24. Finally, if the error_bit is within a third range, R<error_bit≦(N-1), as shown in FIG. 3c, both duplicated errors are carried over in the next codeword C(i+1).

Figure 4:
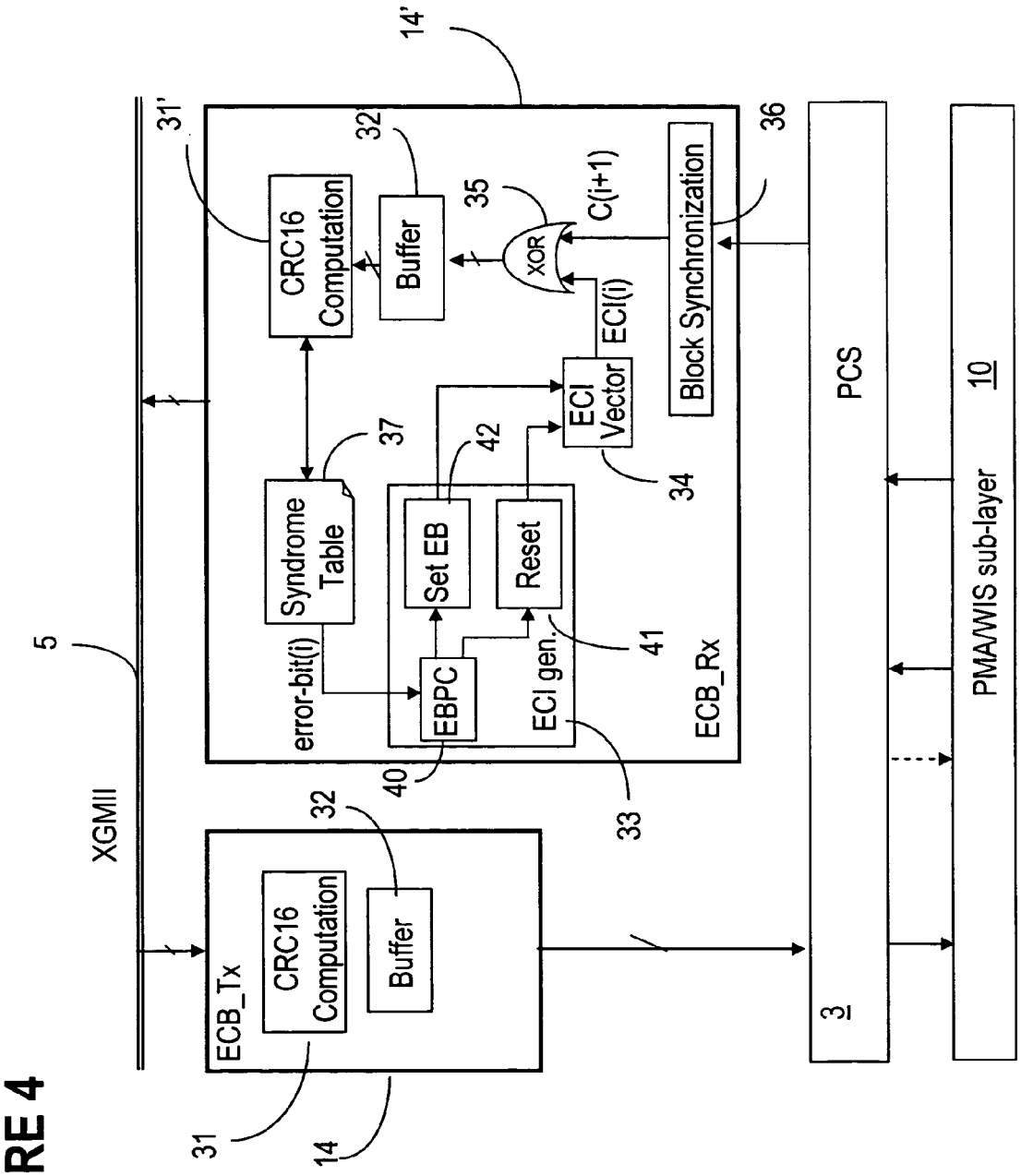
FIG. 4 is the functional block diagram of transmit and receive error control blocks with the main units involved in error correction according to an embodiment of the invention.

FIG. 4 illustrates the block diagram of the invention. This block diagram shows as before the PMA-WIS sub-layer 10, the PCS sub-layer 3 and the interface XGMII 5, which have a similar functionality as described in connection with FIG. 1. Thus, the transmit side 2 and the receive side 6 (not shown in FIG. 4) of the PCS (physical coding sublayer) 3 perform respectively encoding and scrambling of data and decoding and descrambling.

The transmit ECB module 14 includes as in FIG. 1 a buffer 32 which is in this example a 9×8 bytes matrix (an (M+1)×N matrix for a general case), where the first 8 (M) rows are used to temporarily store 8 codewords of data received over the interface 5, and the last row is used for four CRC16, each consisting of two bytes. CRC16 computation block 31 calculates the CRC16 over every two consecutive data codewords in the transmit buffer 32 and stores the results in the last row (M+1) of the buffer 32. Buffer 32 transmits the 9 codewords (8 codewords of data and a codeword with 4 CRC16) to the receive side ECB 14'. It is to be noted that the size of the buffer is provided here by way of example and that the invention is not limited to a 9-codeword buffer 32.

For the general case, we denote the number of codewords in buffer 32 with M. Preferably, M is even, so that the "last row(s)" of the buffer comprises the error codes for all pairs of two consecutive codewords currently in the buffer. The codewords are then transmitted over interface 5 to the receive side. As seen before in connection with FIG. 1, the physical layer 10 is responsible with transmission, synchronization, BER monitoring, etc. (not shown on FIG. 4), as well known.

Before any error detection/correction, the receive ECB module 14' needs to be synchronized, as shown by block synchronization unit 36. The synchronization is needed to enable unit 36 to re-built the matrix structure from the codewords received over PCS 3 in receive buffer 32'. Like the transmit buffer, the receive buffer 32' of ECB 14' hold in this example a 9×8 bytes. The receive CRC16 is calculated over every two consecutive rows (codewords) in receive CRC16 computation unit 31'. If the resulting CRC16 is the same as the transmit CRC16 for the respective two consecutive codewords, no errors have occurred, and the two codewords can be delivered to the interface 5. A difference between the transmit and receive CRC16's will indicate an error in the respective codewords.

The error syndrome is compared against the syndrome table 37 to determine whether the error is correctable or not. If the syndrome is found in the table 37, the error is corrected. The index of the syndrome in the table identifies which bit is in error.

The receiver error control bock ECB_RX 14' also includes an ECI (error carryover indicator) generator 33 that initializes the ECI vector shown generically at 34. Vector 34 is initialized to 0x0000 at power up, and this value is updated every time a codeword is received at the receiver. We call this value "the reset value".

The ECI vector 34 is used to indicate the bit position in the next codeword C(i+1) of any duplicated error that has crossed a codeword boundary (carryover error). This information is calculated by the ECI generator 33 based on the position of the erroneous bit (if any) in a codeword C(i), as determined by units 21' and 37. If a single-bit error is detected and corrected in a codeword C(i) using the syndrome table 37, the value of the ECI vector 34 is updated to a current value denoted here with ECI(i), based on the three possible scenarios illustrated in FIGS. 3a-3c. The ECI vector 34 is now ready to be used in the next round of operation when the next codeword is received. More specifically, ECI(i) is used to correct the carryover error(s), if any.

FIG. 4 also shown generically the operation of the ECI generator. Thus, an erroneous bit position calculator (EBPC) 40 determines the position of the duplicated error(s) in the next codeword C(i+1) based on the position error_bit of the erroneous bit in codeword C(i). As shown in FIGS. 3a-3c, the position of the crossover errors depends on the range of the error_bit in codeword C(i). If error_bit indicates a position in the first range [0, R1], a reset block 41 resets the ECI vector 34 to the reset value (0x0000 in this example). On the other hand, if the error_bit indicates a position outside the first range, the EBPC block 40 determines the position of the erroneous bit(s) in the next codeword C(i+1) and a set error bit block 42 sets to logic '1' the bits of the ECI vector 34 corresponding to the respective position(s).

This information is then used to correct carryover error bits in the next codeword, before it is fed to the error correction block ECB_Rx 14'. This correction can be done for example using a simple XOR operation between the codeword C(i+1) and the ECI vector 34, as shown at 35, where the codeword C(i+1) is XOR-ed with the current value of the ECI vector ECI(i).

After the carryover errors are corrected by the XOR operation, the received codeword C(i+1) is fed to the buffer 32' and CRC16 31' of the error correction block ECB_Rx 14' to be verified for its integrity and corrected as explained in connection with FIG. 1, using syndrome table 37.

Figure 5:
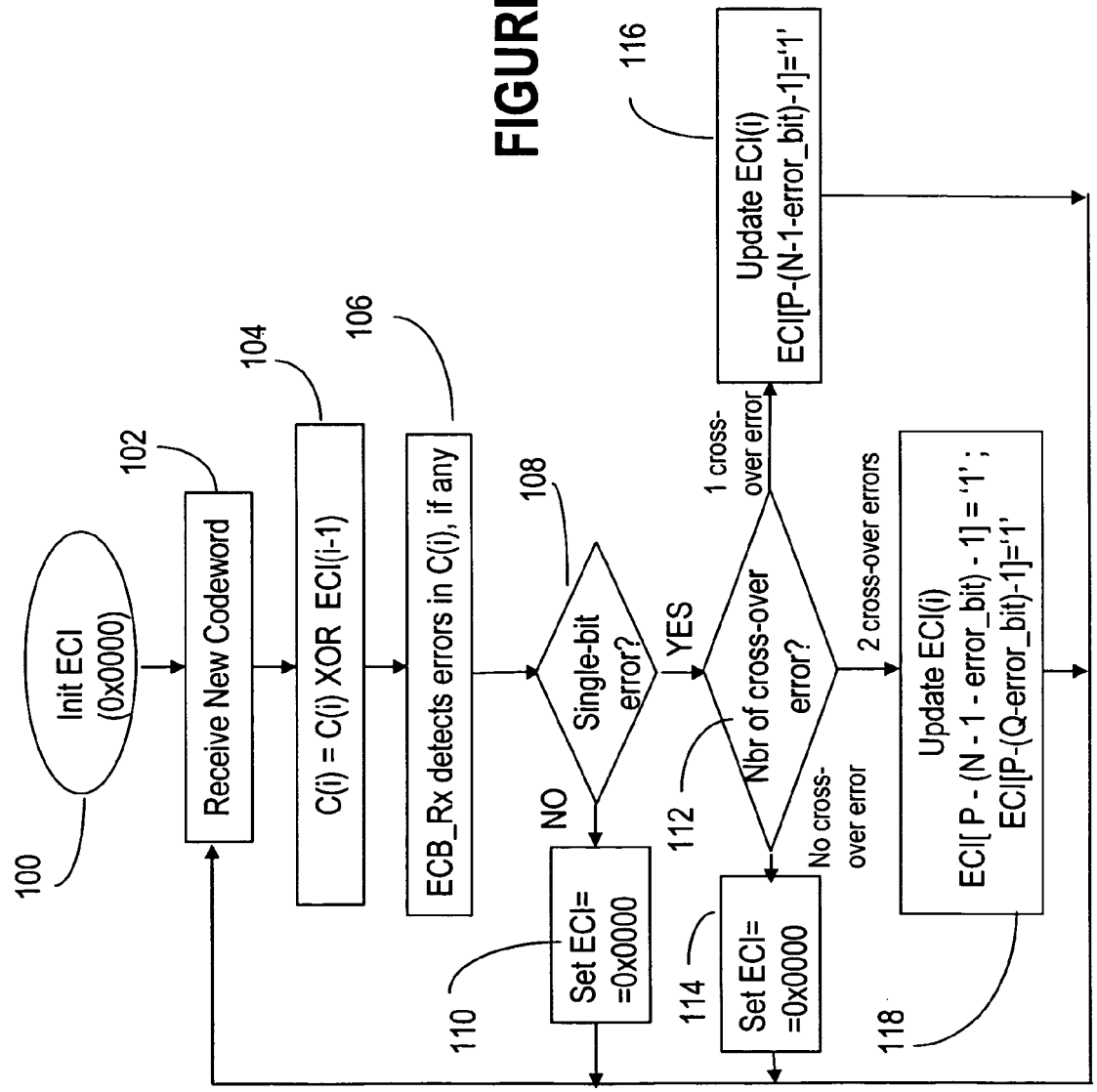
FIG. 5 is a flow chart of the procedure to account for errors crossing the codeword boundary.

The procedure to update the value of the ECI vector is described next in connection with FIG. 5. In this Figure, we consider a general case of a codeword of N bits, and a scrambler polynomial of the form of:

$$x^P + x^Q + 1 \qquad \text{EQ2}$$

The polynomial could also be of the general form $x^m + x^{m-1} + \ldots + 1$. The value of parameters P and Q in the above particular example are 58 and 39 respectively.

As indicated above, the ECI vector is initialized at power-up, as shown in step 100. Once a codeword C(i) is received, as shown in step 102, the current value of the ECI vector (which has been updated for the previous codeword C(i-1)) is XOR-ed with the codeword C(i), step 104. The receiver ECI_Rx 14' detects a respective error in codeword C(i) as shown at 106 and determines if this is a single-bit error or not. Single-bit error correction is performed in steps 108, 110, using CRC16 block 31' and syndrome table 37.

If the respective codeword does not contain any single-bit errors, the ECI vector is set to zero (0x0000) as indicated in step 110. If the respective error is a single-bit error, then there are three possible scenarios, as illustrated by decision block 112, shown in FIGS. 3a, 3b and 3c. Namely:

(a) When both duplicated errors are in the same codeword, i.e. if the error bit position is between 0 and R1 (5 in example of FIG. 3a), the ECI vector is reset to 0x0000, as indicated in step 114.

(b) If one of the duplicated errors crosses the codeword as in example of FIG. 3b, the bit position corresponding to the respective error bit, denoted here with error_bit is set to '1' in the ECI vector, as shown in step 116. This bit position is used to cancel out the duplicated error in the next code word, using an XOR operation. Thus, for the general case, the bit position of the crossover error is determined according to the polynomial of EQ2 used by the scrambler:

$$[P-(N-1-\text{error\_bit})-1]='1' \qquad \text{EQ3}$$

where N is the length of the codeword, and P is the power of the first term in EQ2. For a particular case of a 64-bit long codeword (N=64), the error boundary is between bits 5 (R1) and 24 (R2)

(c) If both of the duplicated errors cross the codeword boundary as in the example of FIG. 3c, two bit positions are corrected (set to '1') in the ECI vector, as shown in step 118. This is when error_bit position is between R2 (24) and N−1 (63). These two bit positions are used to cancel out both crossover errors in the next code word using an XOR operation. The position of the corrected bits is in this case as shown in EQ4:

$$[P-(N-1-\text{error\_bit})-1]='1'; \text{ and}$$

$$[P-(Q-\text{error\_bit})--1]='1' \qquad \text{EQ4}$$

where P and Q are the power of first and second terms of the polynomial used by the scrambler, as shown in EQ2.

To summarize, the above procedure is performed every time a codeword is received and is processed by the ECI block 14' at the receiver, and is found to be in a single-bit error. The syndrome table 37 reports the position of the erroneous bit in the "error_bit" parameter, which then is used by the ECI generator 33 to determine the position of the erroneous crossover bit(s). If the ECB_Rx block 14' does not find any error in the codeword, the above procedure is not executed, and the value of the ECI vector remains 0x0000.

The present specification presents a simple and fast error correction scheme which can be used in conjunction with 64/66 encoding in products where intra-board or inter-shelf connections of high speed elements are required. This error correction scheme enhances significantly the quality of the link with a very easy to implement and as such inexpensive addition to the transmit and receive equipment.

I claim:

1. A method of correcting, at the receive side of a communication system, carryover errors generated by a self-synchronizing scrambler at the transmit side of the communication system, comprising:
   a) defining an error carryover indicator (ECI) vector and initializing said vector to a reset value;
   b) determining the position error_bit of an erroneous bit in a codeword C(i) and correcting said erroneous bit;
   c) if said error_bit is outside a first range defined between bit position 0 and said bit position R1 in said codeword C(i), updating said ECI vector to a current value;
   d) if said error_bit is in said first range, setting said current value of said ECI(i) vector to said reset value;
   e) correcting any carryover error within said codeword C(i+1) using said current value ECI(i) of said ECI vector; and
   f) repeating steps b-e for each codeword received at said received side, wherein N is the number of bits in a codeword.

2. The method of claim 1, wherein step b) comprises:
   placing M codewords of N bits into an (M+m)×N receive buffer, where M is an even number;
   placing in said receive buffer M/2 transmit error codes, each transmit error code calculated at the transmission side for a pair of successive codewords;
   calculating a receive error code for each pair of successive codewords in said receive buffer and comparing each said transmit error code with a respective receipt error code; and
   identifying the position error_bit by consulting a syndrome table prepared for said communication system and correcting said erroneous bit accordingly.

3. The method of claim 1, wherein said self-synchronizing scrambler uses a polynomial of the form: $x^P+x^Q+1$, where P and Q are whole numbers.

4. The method of claim 3, wherein said step c) comprises determining said bit position R1 as the difference between bit position (N−1) in said codeword C(i) and the power P of the first term of said polynomial R1=(N−1)−P.

5. The method of claim 4, wherein said step o) comprises updating to logic '3'1' a first bit position [P−(N−1−error_bit)−1] in said ECI vector, whenever said error—bit is in a second range (R1<error_bit≦R2) within said codeword C(i), between said bit position R1 and a bit position R2.

6. The method of claim 5, further step c) further comprises determining said bit position R2 as the difference between the bit position (N−1) in said codeword C(i) and the power Q of the second term of said polynomial R2=(N−1)−Q.

7. The method of claim 3, wherein N=64 and said reset value for said ECI vector is 0x0000.

8. The method of claim 4, wherein said step c) comprises updating to logic '1' a first bit position [P−(N−1−error_bit)−1] and a second bit position [P−(Q−error_bit)−1] in said ECI(i) vector whenever said error_bit is in a third range (R<error_bit≦(N−1)) within said codeword C(i), between a second bit position R2 and the bit position (N=1).

9. The method of claim 8, wherein N=64, said reset value of ECI vector is 0x0000, P=58 and Q=39, resulting in R1=5 and R2=24.

10. The method of claim 8, wherein said step e) comprises XOR-ing said codeword C(i+1) and said current value ECI(i) of said ECI vector for reversing a first erroneous bit in said first bit position [P−(N−1−error_bit)−1] and a second erroneous bit in said second bit position [P=(Q=error_bit)=1] in said codeword C(i+1).

11. The method of claim 5, wherein said step e) comprises XOR-ing said codeword C(i+1) and said current value ECI(i) of said ECI vector for reversing a first erroneous bit on said first bit position [P−(N−1−error_bit)−1] in said codeword C(i+1).

12. An error control black receiver (ECB_Rx) for decoding N-bit codewords that have been scrambled at transmission using a self-synchronizing scrambler, comprising:
   means for storing M codewords;
   error computation means for detecting and correcting a single-bit error in a codeword C(i);

a syndrome table for determining the bit position error_bit of said single-bit error;

an error carryover indicator (ECI) generator for locating a carryover error in a next codeword C(i+1), induced by said single-bit error; and means for correcting said carryover error using said ECI vector.

13. The ECB receiver of claim 12, wherein said means for storing comprises an (M+1)×N buffer for storing M successive codewords and their respective error correction information; and a block synchronizer, for aligning said successive codewords in said buffer.

14. The ECB receiver of claim 12, wherein said ECI generator comprises:

means for determining the range of said carryover error in said codeword C(i+1);

means for updating said ECI vector to a current value ECI(i) whenever said error_bit is outside a first range (0<error_bit ≦R1) defined between bit position 0 and said bit position R1 in said codeword C(i); and means for resetting said current value of said ECI vector to a reset value whenever said error_bit is in said first range.

15. The ECB receiver of claim 14, wherein said means for updating changes to logic '1' a first bit position [P−(N−1−error_bit)−1] in said ECI vector, whenever said error_bit is in a second range (R1<error_bit≦R2) within said codeword C(i), between said bit position R1 and a bit position R2.

16. The ECB receiver of claim 14, wherein said means for updating changes to logic '1' a first bit position [P−(N−1−error_bit)−1] and a second bit position [P−(Q−error_bit)−1] in said ECI(i) vector, whenever said error_bit is in a third range (R3<error_bit≦(N−1)) within said codeword C(i), between said bit position R2 and the bit position (N−1).

17. The ECB receiver of claim 14, wherein, whenever said self-synchronous scrambler uses a polynomial of the form: $x^P+x^Q+1$, where P and Q are whole numbers, said means for determining calculates said bit position R1 as the difference between the bit position (N−1) in said codeword C(i) and the power P of the first term of said polynomial R1=(N−1)−P.

18. The ECB receiver of claim 14, wherein, whenever said self-synchronous scrambler uses a polynomial of the form: $x^P+x^Q+1$, where P and Q are whole numbers, said means for determining calculates said bit position R2 as the difference between the bit position (N−1) in said codeword C(i) and the power Q of the second term of said polynomial R2=(N−1)−Q.

19. The ECB receiver of claim 12, wherein said means for correcting comprises an XOR block for correcting said next codeword C(i+1) as specified by said ECI vector.

* * * * *